(12) United States Patent
Kosuge

(10) Patent No.: US 6,195,781 B1
(45) Date of Patent: Feb. 27, 2001

(54) ERROR CORRECTION CODE CALCULATOR

(75) Inventor: Shoji Kosuge, Kanagawa (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/113,005

(22) Filed: Jul. 9, 1998

(30) Foreign Application Priority Data

Jul. 10, 1997 (JP) .................................................. 9-185083

(51) Int. Cl.⁷ ....................................................... H03M 13/00
(52) U.S. Cl. ................................................................ 714/784
(58) Field of Search .................................. 714/755, 752, 714/756, 784

(56) References Cited

U.S. PATENT DOCUMENTS

| 5,392,299 | * | 2/1995 | Rhines et al. | 714/756 |
| 5,696,774 | * | 12/1997 | Inoue et al. | 714/755 |
| 5,729,647 | * | 3/1998 | Kim | 386/46 |
| 5,887,006 | * | 3/1999 | Sharma | 714/784 |

* cited by examiner

Primary Examiner—Albert De Cady
Assistant Examiner—Shelly A Chase
(74) Attorney, Agent, or Firm—Frommer Lawrence & Haug, LLP.; William S. Frommer; Dexter T. Chang

(57) ABSTRACT

A Reed Solomon error correction code calculator is disclosed, that comprises a plurality of modules, each of which has a memory, a matrix calculator, and an exclusive-OR circuit, the plurality of modules being cascade connected, and at least one register disposed between each of the plurality of modules.

5 Claims, 10 Drawing Sheets

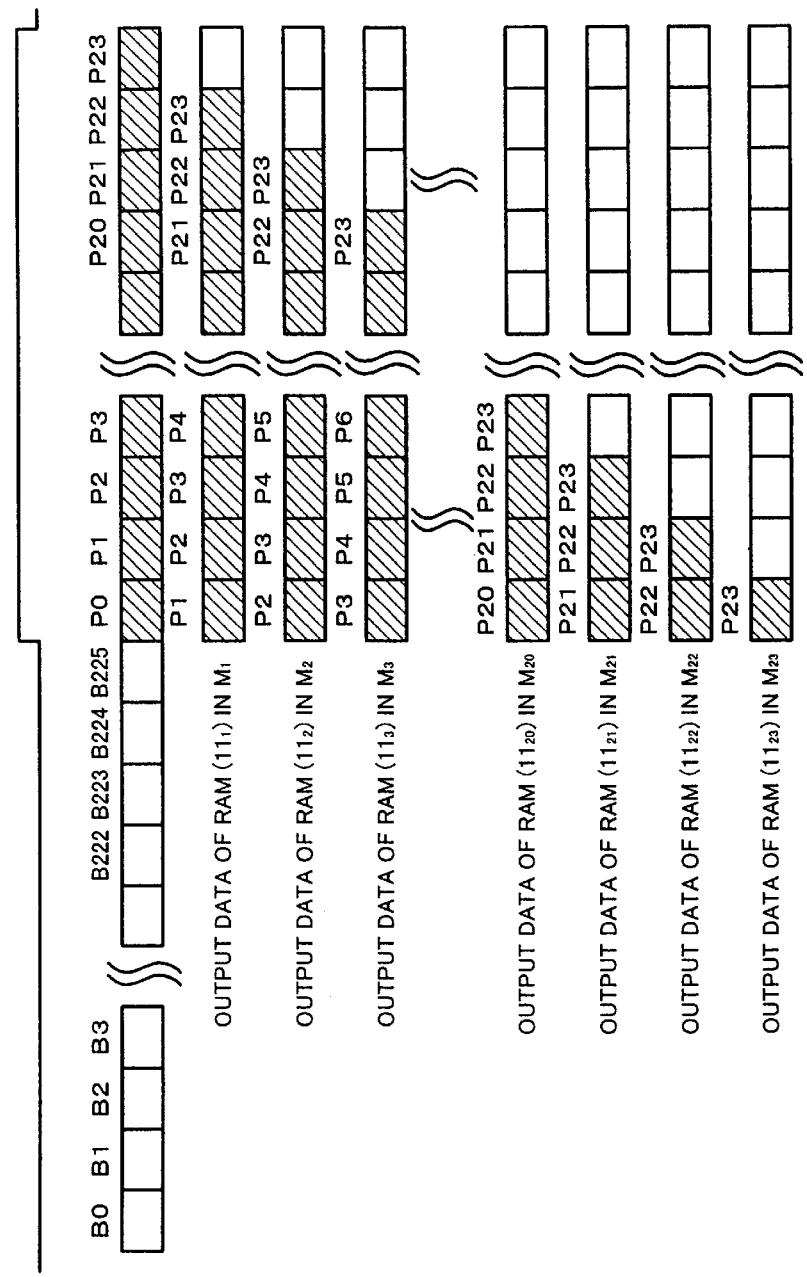
Fig. 12A INPUT DATA
Fig. 12B INITIALIZATION SIGNAL
Fig. 12C SW CONT SIGNAL
Fig. 12D OUTPUT DATA

ERROR CORRECTION CODE CALCULATOR

BACKGROUND OF THE INVENTION

1. Field of the Invention

The present invention relates to a Reed Solomon error correction code calculator for use with a digital video signal recording apparatus or the like.

2. Description of the Related Art

FIG. 1 shows an example of the structure of a conventional Reed Solomon error correction code calculator 110. Unless an SW Cont signal is active (this state will be described later), switches 105 and 106 are placed in positions as shown in FIG. 1. The Reed Solomon error correction code calculator 110 is initialized corresponding to the first one symbol (for example, one byte) of input data to be encoded. In other words, when the input data is supplied to the Reed Solomon error correction code calculator 110, an initialization signal is supplied to selectors 104$_1$ to 104$_{n-1}$. While the initialization signal is being supplied, the selectors 104$_1$ to 104$_{n-1}$ supply output signals of matrix calculators 100$_1$ to 100$_{n-1}$ to circuits on downstream stages, respectively. The selector 104$_n$ supplies 00$h$ to an exclusive-OR gate (hereinafter referred to as EX-OR gate) 103$_n$ that performs an exclusive OR operation.

Thus, the initial input data is supplied as feedback data to the matrix calculators 100$_1$ to 100$_{n-1}$. Calculated results of the initial input data are supplied to the registers 101$_1$ to 101$_{n-1}$.

After such an initializing process is completed, the subsequent input data is supplied to the EX-OR gate 103$_n$ on the last stage. Output data of the register 104$_n$ on the last stage is supplied to the EX-OR gate 103$_n$. The EX-OR gate 103$_n$ exclusive-ORs each of the second or later input data and output data of the register on the last stage and outputs the calculated result as feedback data.

In the initializing process and error correction code calculating process, input data to be encoded is supplied to a data processing means on a downstream stage through the switch 106. Individual registers store parities to be added to input data to be encoded. When such processes are completed, the parities are added to the input data.

When the SW Cont signal becomes active, the switch 105 is placed in a position of which 00$h$ (h represents hexadecimal notation) is supplied as feedback data. When 00$h$ is supplied as feedback data to the matrix calculators 100$_1$ to 100$_{n-1}$, the matrix calculators 100$_1$ to 100$_{n-1}$, output 00$h$ since, the matrix calculator 100$_1$ to 100$_{n-1}$ is composed with EX-OR gates. Thus, the EX-OR gates 103$_1$ to 103$_{n-1}$ (not EX-OR gate 103$_n$ on the last stage) that receive output data of the matrix calculators 100$_1$ to 100$_{n-1}$ and output data of the registers on the preceding stages always supply output data of the registers on the preceding stages to the registers on the next stages. In other words, in this case, the registers 101$_1$ to 101$_n$ structure a shift register.

When the SW Cont signal becomes active, the switch 106 is placed in a position of which output data of the register 104$_{n-1}$ on the last stage is supplied to a circuit on the next stage. Thus, parities to be added are successively output to circuits on the next stages. Thus, a corrected code is structured.

To add parities, a circuit structure of which output data of registers is selected by selectors may be used. To decrease the number of selectors and flexibly change the number of parities, conventionally, a circuit structure shown in FIG. 1 is used.

To correct an error of digital data, a product code encoding method for encoding data with an inner code and an outer code has been widely used. When an error of pixel data is corrected, an outer code parity is added. Thereafter, to encode the resultant data with an inner code, the data array is converted and then an inner code parity is added. The resultant data array is recorded as it is.

When data is reproduced, an error thereof is corrected in the following manner. First, an error of the reproduced data is corrected with an inner code. Thereafter, to correct an error of the data with an outer code, the data array is converted and then the error of the data is corrected with an outer code. After the error of the data is corrected with the outer code, the data is restored to the original data array. Thus, the data array is converted twice in the recording operation and the reproducing operation.

When original data to be encoded has been compressed, each compressing unit of data (for example, each block) varies corresponding to the compressing method of the original data. Thus, adding processes of an inner code and an outer code and an error correcting process therewith become complicated.

When data is recorded with an error correction code, a data array is converted in the vertical direction. Thereafter, an outer code parity is added. Next, to encode the resultant data array with an inner code, the data array is converted in the horizontal direction. An inner code parity is added to each block of data. The resultant data is recorded in the inner code sequence.

When data is reproduced with an error correction code, an error of the reproduced data is corrected with an inner code. Thereafter, to correct an error of the data with an outer code, the data array is converted and then the resultant data is corrected with an outer code. In addition, the data array should be restored to the original data array. In the recording operation and reproducing operation, the data array is converted four times in total.

When original data has been compressed, the data array converting process should be performed twice as many as that of the normal pixel data. In addition, to convert the data array, two RAMs (Random Access Memories) each of which has a storage capacity for data of a product code should be disposed in the Reed Solomon error correction code calculator. In addition, the delay due to the data array converting process becomes twice as many as the length of the product code.

OBJECTS AND SUMMARY OF THE INVENTION

Therefore, an object of the present invention is to provide an error correction code calculator that encodes data with a product code without need to perform a data array converting process.

A first aspect of the present invention is a Reed Solomon error correction code calculator, comprising a plurality of modules, each of which has a memory, a matrix calculator, and an exclusive-OR circuit, the plurality of modules being cascade connected, and at least one register disposed between each of the plurality of modules.

A second aspect of the present invention is an error correction code calculator for encoding data with a product code for dually encoding each symbol, the product code being a Reed Solomon inner code and a Reed Solomon outer code, comprising a plurality of memories, each of which has a storage capacity for the number of symbols for an interleave length or equivalent thereto.

Thus, according to the present invention, an encoding process with a product code can be performed without need to convert a data array in the vertical and horizontal directions.

These and other objects, features and advantages of the present invention will become more apparent in light of the following detailed description of a best mode embodiment thereof, as illustrated in the accompanying drawings.

BRIEF DESCRIPTION OF THE DRAWINGS

FIGS. 12A to 12D are timing charts for explaining a process performed in the structure shown in FIG. 6.

DETAILED DESCRIPTION OF THE PREFERRED EMBODIMENT

Figure 2:
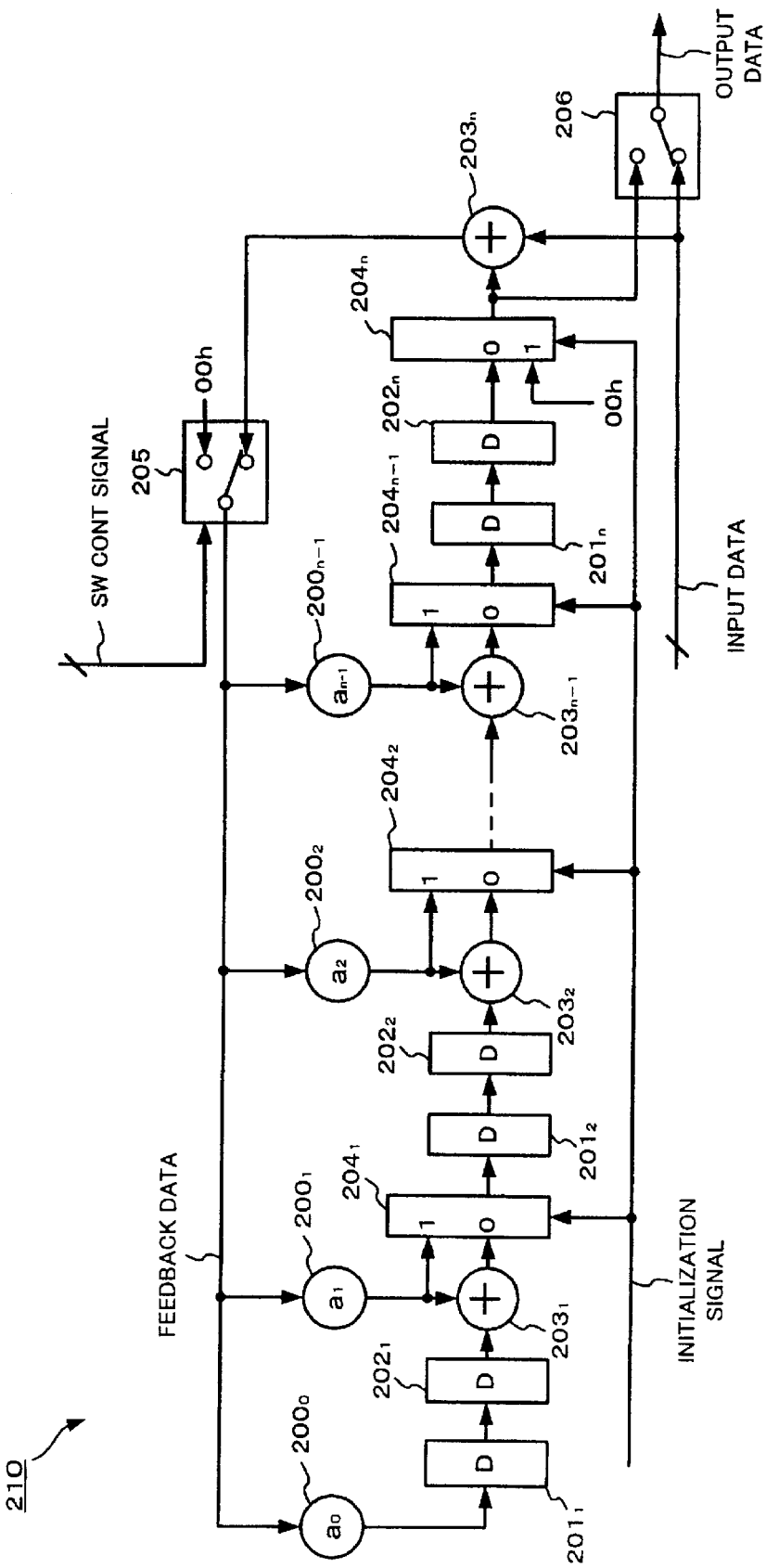
FIG. 2 is a block diagram for explaining the structure of an error correction code calculator that encodes data with two outer code sequences without need to perform a data array converting process.

As a method for solving the problem of the prior art reference, a plurality of registers are disposed between each matrix calculator. Thus, a plurality of code sequences are interleaved without need to convert a data array. For example, as shown in FIG. 2, two registers are cascade-connected between each matrix calculator so as to generate two outer code sequences without need to convert a data array. In other words, calculated results of a first outer code sequence are stored in registers $201_0$ to $201_n$. The calculated results of a second outer code sequence are stored in registers $202_0$ to $202_n$.

Figure 3:
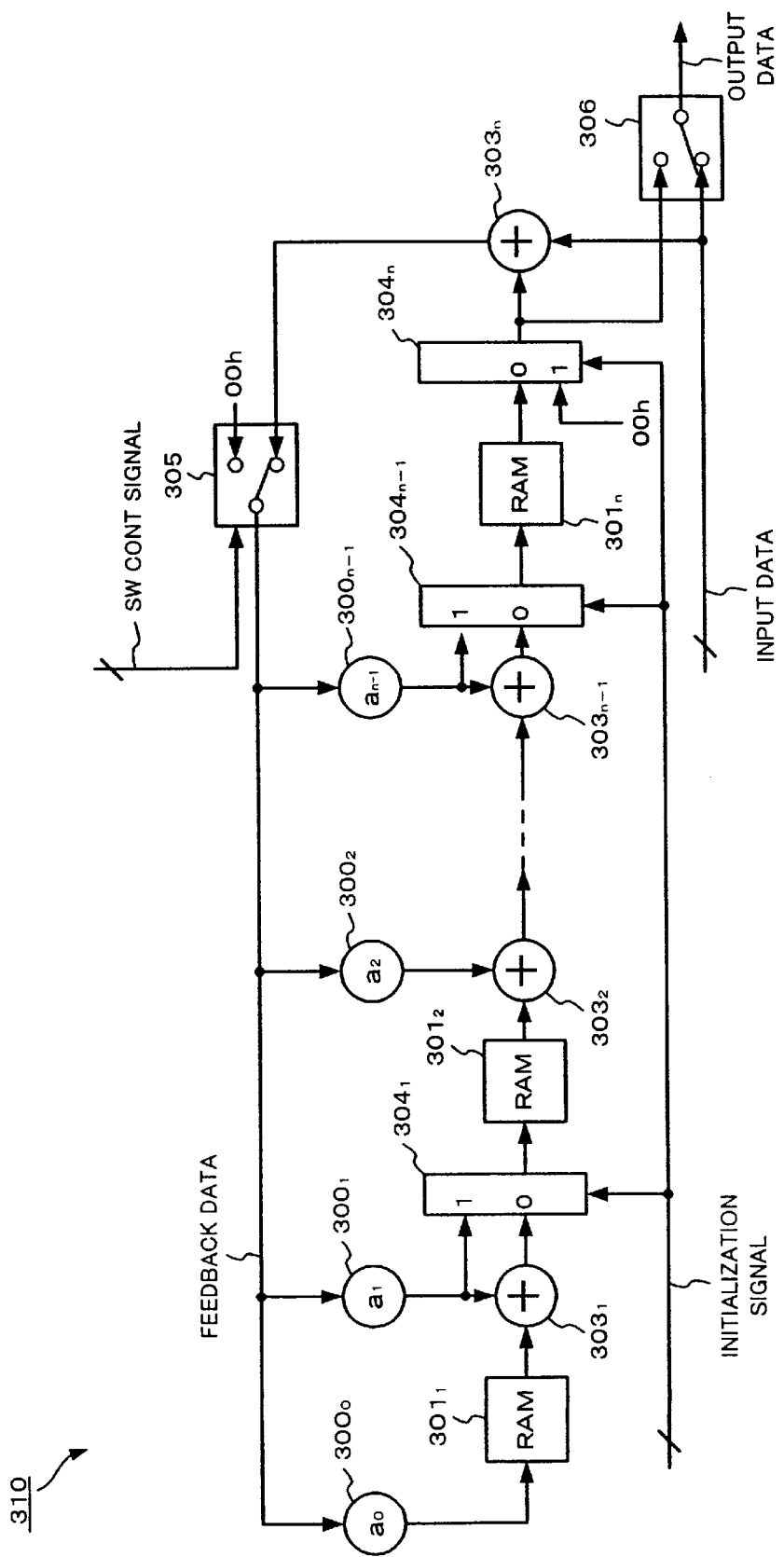
FIG. 3 is a block diagram for explaining the structure of an error correction code calculator according to the present invention.

As shown in FIG. 3, to generate more outer code sequences, registers disposed between each matrix calculator are composed of a RAM. Thus, the multiplexing degree of signals can be increased.

Figure 4:
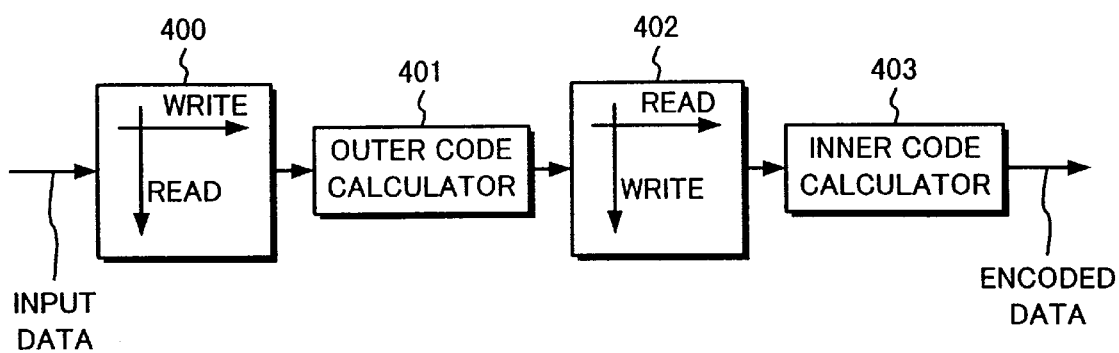
FIG. 4 is a schematic diagram for explaining the case that a data array converting process is included in an error correction code calculating process.

Next, for easy understanding of the present invention, with reference to FIG. 4, an encoding process with a product code in a conventional code calculator will be described.

First, input data is successively written in the horizontal direction to a data array converting RAM 400. After the input data has been written to the data array converting RAM 400, data is successively read in the vertical direction from the data array converting RAM 400 and supplied to an outer code calculator 401. In such a manner, data is encoded with an outer code (namely, in the vertical direction).

Figure 1:
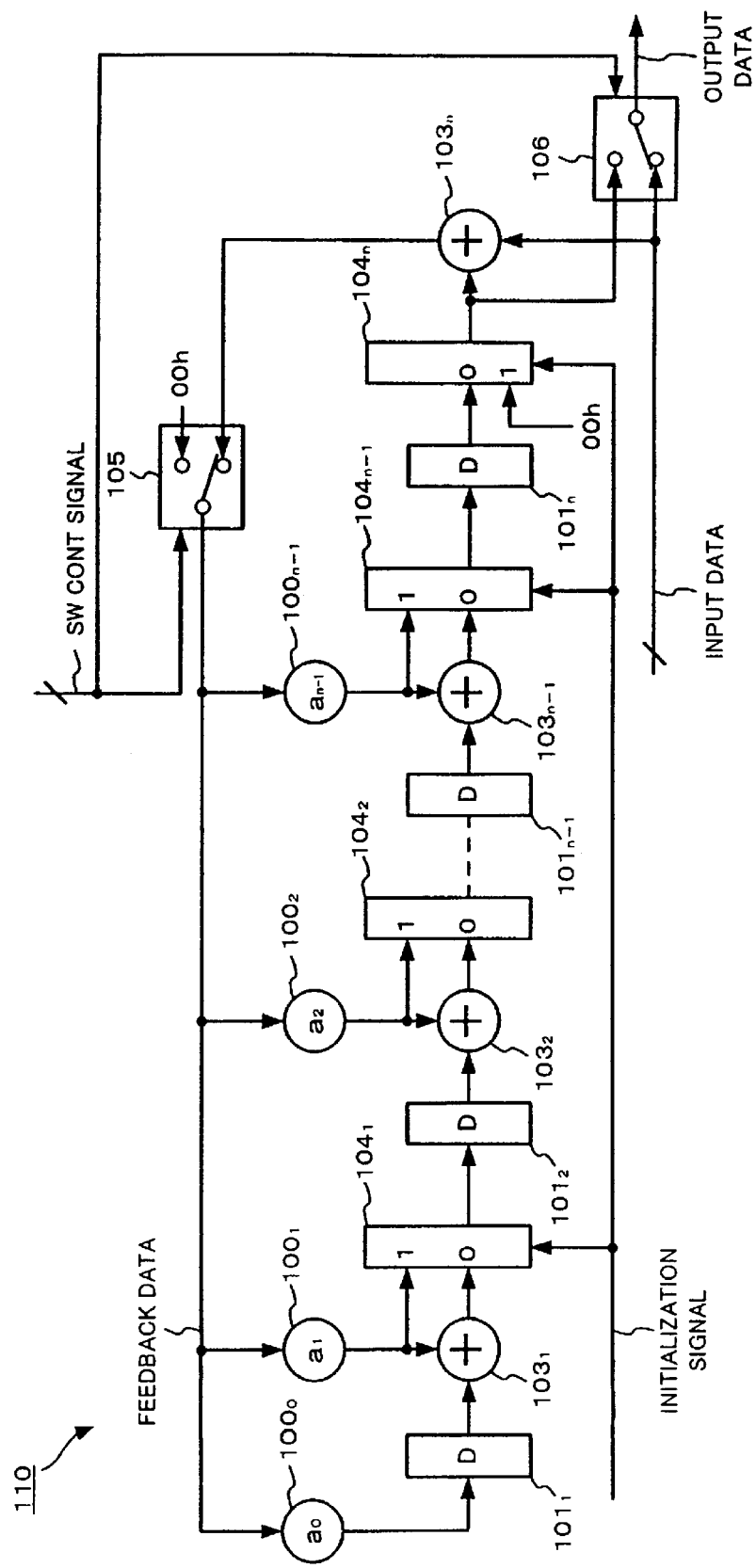
FIG. 1 is a block diagram for explaining an example of the structure of a conventional error correction code calculator.

Next, output data of the outer code calculator 401 is successively written in the vertical direction to a data array converting RAM 402. After the data has been written to the data array converting RAM 402, the data is successively read in the opposite direction (namely, the horizontal direction) from the data array converting RAM 402 and then supplied to an inner code calculator 403. In such a manner, data is encoded with an inner code (namely, in the horizontal direction). Thus, the encoding process with the product code is completed. In this case, as the outer code calculator 401 and the inner code calculator 403, the code calculator 110 shown in FIG. 1 may be used.

Figure 5:
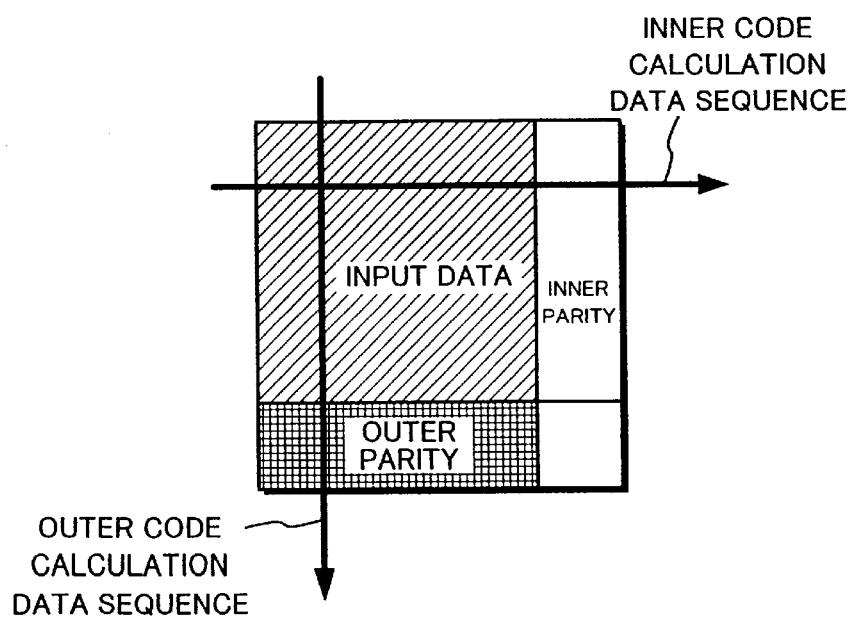
FIG. 5 is a schematic diagram for explaining the storage capacity required for each memory in the structure shown in FIG. 4.

In such an encoding method, the data array converting RAM 400 should have a storage capacity for input data represented by hatched lines shown in FIG. 5. In addition, the data array converting RAM 402 should have a total of a storage capacity for the input data shown in FIG. 4 and a storage capacity for the outer code represented by mesh lines shown in FIG. 5. Thus, to convert a data array, the code calculator should have a RAM with a storage capacity that is nearly twice as much as the data amount of input data for one encoding unit of the product code.

Figure 6:
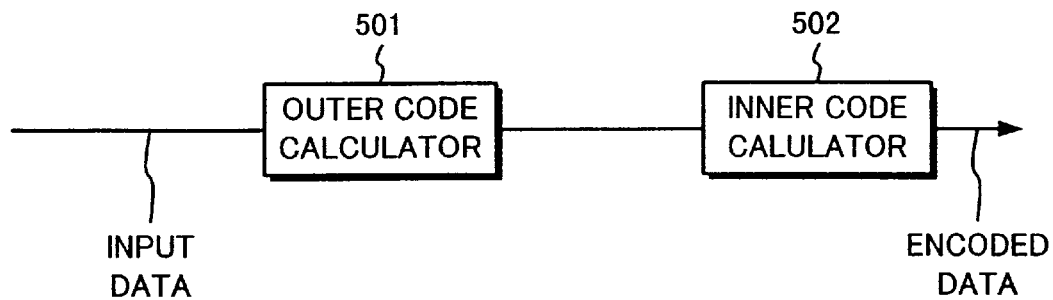
FIG. 6 is a schematic diagram for explaining the case that a data array converting process is not included in the error correction code calculating process.

Next, with reference to FIG. 6, an encoding process with a product code in a code calculator having a RAM disposed between each matrix calculator (the code calculator is shown in FIG. 3) will be described. Input data is successively supplied to an outer code calculator 501. After one encoding unit of the product code of the input data has been supplied, the encoding process with the outer code is completed. Output data of the outer code calculator 501 is supplied to an inner code calculator 502. The inner code calculator 502 encodes the input data with an inner code.

In such a manner, the encoding process with the product code is completed. As the outer code calculator 501, for example, the code calculator 310 shown in FIG. 3 can be used. As the inner code calculator, for example, the code calculator 110 shown in FIG. 1 can be used.

Figure 7:
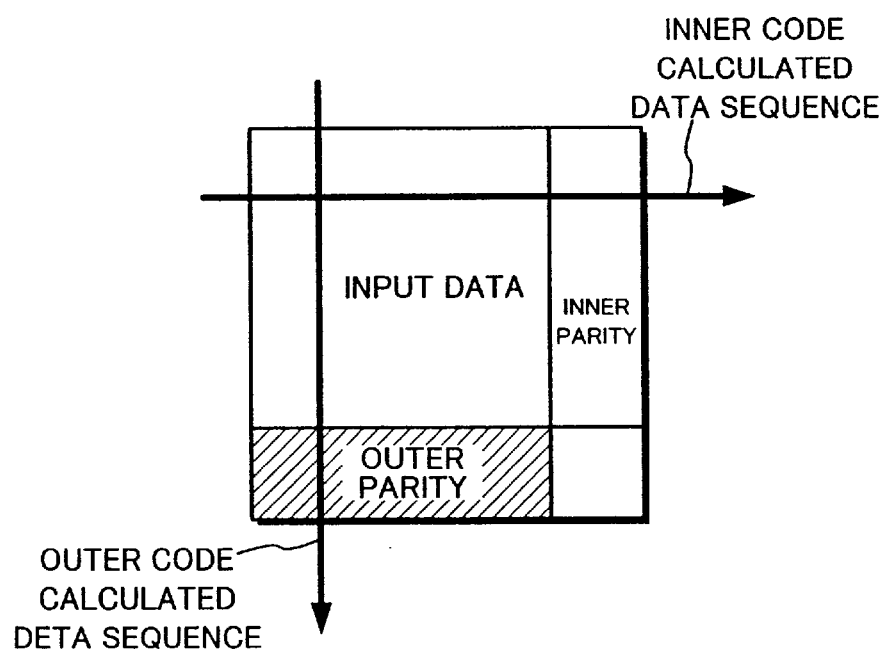
FIG. 7 is a schematic diagram for explaining the storage capacity required for each memory in the structure shown in FIG. 6.

In such an encoding method, the data array converting RAMs are not required. In addition, the storage capacity required for the RAM (which generates a code in the vertical direction) of the outer code calculator 501 is only the portion denoted by hatched lines in FIG. 7. Thus, in such an encoding method, with an improvement of high integration of ASIC (Application Specific Integrated Circuit), data can be encoded with a product code without need to use an external RAM.

However, in such a method, calculated results of matrix calculators $300_1$ to $300_{n-1}$ (that receive output data of an EX-OR gate 303 that receives the input data and output data of a register $304_n$ on the last stage) should be supplied to RAMs $301_1$ to $301_n$, respectively. Thus, in the ASIC structure, depending on the locations of the RAMs $301_1$ to $301_n$, since the connection length thereof becomes long, timings of the output signals of the RAMs $301_1$ to $301_n$ deviate. Consequently, the operation of the apparatus is adversely affected.

When an ASIC is newly designed, a required process is selected in consideration of the cost, performance, and other factors. The restrictions of timings of data processes mainly result from operation speeds of a RAM in the ASIC. In addition, to allow a selected process to operate at the clock speed as the maximum speed, the internal RAM should be operated at high speed.

When a high speed process is newly designed, a reduction of the designing period may be often required. In such a circumstance, without sufficient consideration of timings of a peripheral portion of a RAM in the ASIC, it takes a long time to design the locations and connections of structural portions of the ASIC.

In developing and designing an ASIC with such a circuit structure, particular functional requirements such as an increase of the number of parities in an outer code encoding process and an improvement of the operation speed of the ASIC may not be accomplished.

However, due to restrictions of line connections, buffering of feedback data, and timing conditions of a peripheral circuit of a RAM, a discrete circuit is not used.

Figure 8:
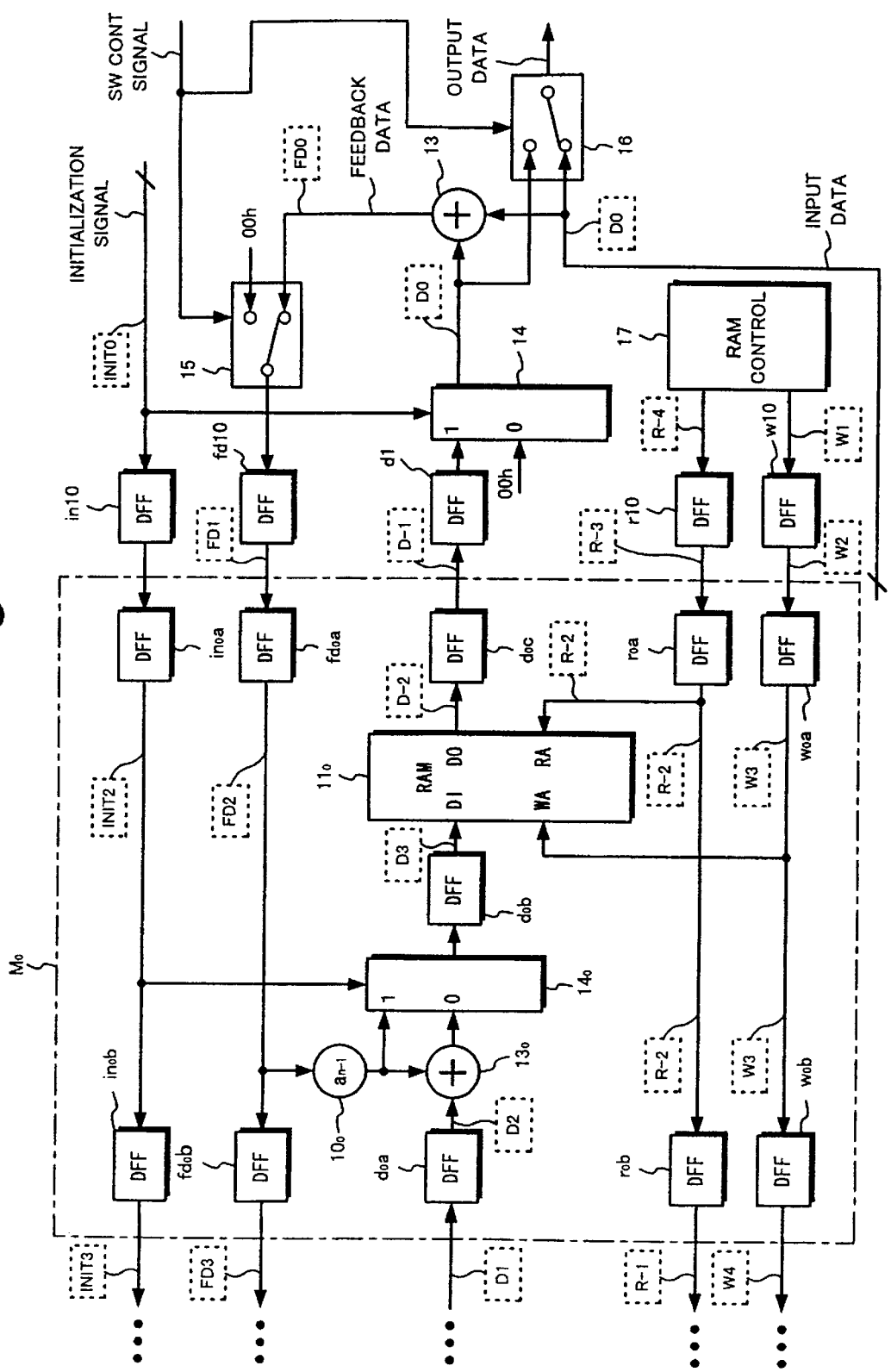
FIG. 8 is a block diagram showing a part of the structure of an embodiment of the present invention.
Figure 9:
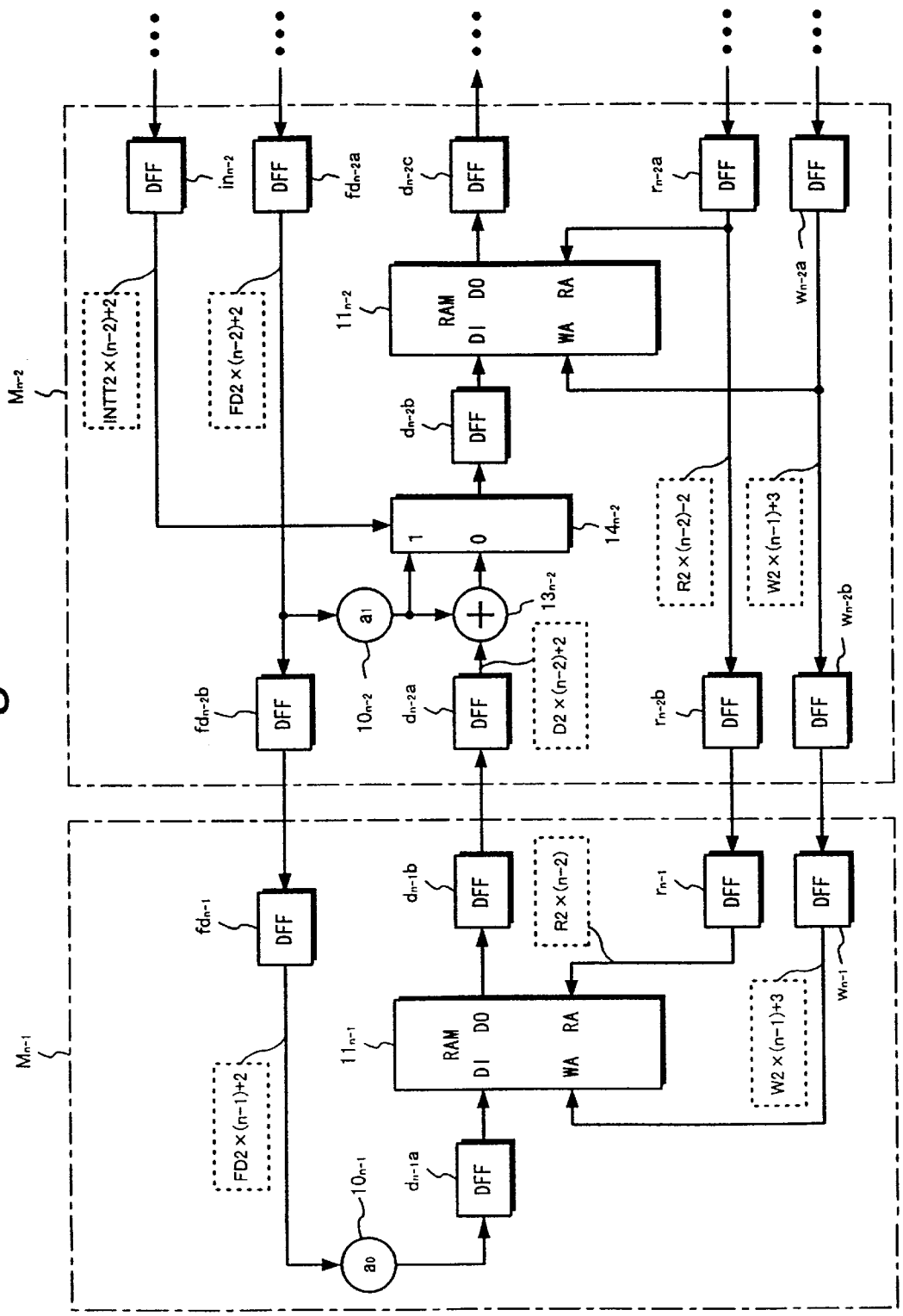
FIG. 9 is a block diagram showing another part of the structure of the embodiment of the present invention.

Next, with reference to FIGS. 8 and 9, a structure for solving such a problem will be described as an embodiment of the present invention. FIGS. 8 and 9 show a first part and a second part of a block diagram showing the structure of an error correction code calculator according to the embodiment of the present invention. The error correction code calculator comprises (n-1) modules $M_0, M_1, \ldots,$ and $M_{n-2}$. Each of the modules $M_0, M_1, \ldots,$ and $M_{n-2}$ has a matrix calculator, an EX-OR gate, a selector, an RAM, a register (for example, a D-type flip-flop (hereinafter referred to as DFF)). The module $M_{n-1}$ on the last stage comprises a matrix calculator and a RAM.

The number of RAMs $11_0$ to $11_{n-1}$ of the modules corresponds to the number of sequences of outer code parities. Thus, FIGS. 8 and 9 show the structure for generating an error correction code composed of n parities (thus, the number of modules is n).

In addition to the modules, the error correction code calculator further comprises an RAM controller 17, a selector 14, an EX-OR gate 13, a feedback data selecting switch 15, and an output data selecting switch 16. The RAM controller 17 supplies a write address signal and a read address signal to the RAM of each module. The feedback data selecting switch 15 outputs one of output data of the EX-OR gate 13 and 00h as feedback data corresponding to the SW Cont signal. The output data selecting switch 16 selects one of input data or output data of the selector 14 as final output data corresponding to the SW Cont signal. In addition, the error correction code calculator has DFF in10, DFF fd10, DFF d10, DFF r10, and DFF w10 on paths of the initialization signal, feedback data, data in a calculating process, read address signal, and write address signal, respectively.

Unless the SWCont signal is active (this state will be described later), the feedback data selecting switch 15 and the output data selecting switch 16 are placed in positions shown in FIG. 8. In these switch positions, output data of the EX-OR gate 13 is feedback data. On the other hand, input data is supplied to the EX-OR gate 13. In addition, the input data is supplied to a data processing means such as an inner code calculator 502 shown in FIG. 6 through the output data selecting switch 16.

Signals necessary for the operation of the error correction code calculator are supplied as follows. The initialization signal is supplied to selectors of the modules $M_0$ to $M_{n-2}$. Feedback data as output data of the feedback data selecting switch 15 is supplied to EX-OR gates of the modules $M_0$ to $M_{n-1}$. In addition, the write address signal and the read address signal generated by the RAM controller are supplied to RAMs of the modules $M_0$ to $M_{n-1}$.

Next, the locations of the DFFs of the error correction code calculator according to the embodiment of the present invention will be described. In the (n-1) modules $M_0$ to $M_{n-2}$, individual DFFs are disposed on the preceding stage of an EX-OR gate, on the next stage of a selector (namely, on the preceding stage of a RAM), and on the next stage of a RAM in paths thereof. For example, in the module 0, a DFF $r_0a$ is disposed on the preceding stage of the EX-OR gate. A DFF $r_0b$ is disposed on the next of a selector $14_0$ (namely, on the preceding stage of a RAM $11_0$). In addition, a DFF $r_0c$ is disposed on the next stage of the RAM $11_0$.

On the other hand, since the module $M_{n-1}$ does not have an EX-OR gate, a DFF $r_{n-1}a$ and a DFF $r_{n-1}b$ are disposed on the preceding stage and the next stage of a RAM $11_{n-1}$, respectively.

To match timings of individual processes on paths of the DFFs with timings of other signals for data processes, DFFs are disposed on paths of other signals.

Two DFFs are disposed in each of the modules $M_0$ to $M_{n-2}$ on the path of the initialization signal supplied to the selectors of the modules $M_0$ to $M_{n-2}$. For example, a DFF $in_0a$ and a DFF $in_0b$ are disposed in the module $M_0$.

In addition, two DFFs are disposed on the path of the feedback data supplied to the EX-OR gates of the modules $M_0$ to $M_{n-2}$. For example, a DFF $fd_0a$ and a DFF $fd_0b$ are disposed in the module $M_0$. Only a DFF $fd_{n-1}$ is disposed on the path of the feedback data in the module $M_{n-1}$.

On the other hand, two DFFs are disposed on the paths of the write address signal and the read address signal supplied to the RAMs of each of the modules $M_0$ to $M_{n-2}$. For example, a DFF $r_0a$ and a DFF $r_0b$ for the read address signal are disposed in the module $M_0$. A DFF $w_0a$ and a DFF $w_0b$ for the write address signal are disposed in the module $M_0$. However, only a DFF $r_{n-1}$ for the read address signal is disposed in the module $M_{n-1}$. In addition, a DFF $w_{n-1}$ for the write address signal is disposed in the module $M_{n-1}$.

In such a structure, the operation speed of the RAM in each module becomes optimum.

Next, the operation in such a structure will be described. In FIGS. 8 and 9, alphabetic characters and numeric characters in boxes with dotted lines represent phases of individual signals to the input signal D0. As alphabetic characters, INIT represents the initialization signal; FD represents the feedback data; D represents data in a calculating process; R represents the read address signal; and W represents the write address signal.

Thus, D1 represents data in a calculating process. The data D1 has a delay of one clock pulse against the input signal D0. On the other hand, R-2 represents the read address signal with an advance of two clock pulses against the input signal D0. In addition, FD2x(n-1)+2 represents feedback data with a delay of {2×(n-1)+2} clock pulses against the input signal D0.

To correctly encode data with a product code, the delay of feedback data that is input to the matrix calculator of each module is matched with the delay of a signal that is input as a signal in a calculating process to the RAM thereof. In reality, DFFs shown in FIGS. 8 and 9 are disposed so that signals are input in such a manner. For example, in the module $M_0$, a signal FD2 is input to a matrix calculator $10_0$. A signal D2 is input to an EX-OR gate $13_0$.

Next, a process in the case that data to be encoded is input will be described. For example, when top data of one byte is input, the initialization signal is supplied to the selector 14. While the initialization signal is being supplied, output data of the selector 14 is 00h. Thus, output data of the EX-OR gate 13 is the input data. Unless a parity that has been calculated is supplied, the feedback data selecting switch 15 supplies output data of the EX-OR gate 13 as feedback data to each module. Thus, the top data of one byte is supplied with delays to the selectors $14_0$ to $14_{n-2}$.

The initialization signal is supplied with delays to the selectors $14_0$ to $14_{n-2}$. While the initialization signal is being supplied, output data of the selectors $14_0$ to $14_{n-2}$ is output data of the matrix calculators $10_0$ to $10_{n-2}$ disposed on the preceding stages of the selectors $14_0$ to $14_{n-2}$, respectively. Thus, the calculated results of the matrix calculators $10_0$ to $10_{n-2}$ are directly input to the RAMs $11_0$ to $11_{n-2}$, respectively. Consequently, the RAMs $11_0$ to $11_{n-2}$ are initialized with the input data.

In reality, the top data is input with a delay of two clock pulses as feedback data FD2 to the matrix calculator $10_0$ of the module $M_0$. Output data of the matrix calculator $10_0$ is supplied to the selector $14_0$. Although the output data of the EX-OR gate $13_0$ is supplied to the selector $14_0$, in the initializing state, since a signal INIT2 is supplied to the selector $14_0$, the selector $14_0$ selects output data of the matrix calculator $10_0$ and outputs the selected data to a DFF $d_0b$ on the next stage thereof. Output data of the DFF $d_0b$ is supplied as data D3 in a calculating process with a delay of three clock pulses against the input data to the RAM $11_0$.

On the other hand, a write address signal W3 with a delay of three clock pulses against the input signal D0 is supplied to the RAM $11_0$. The write address signal W3 causes the data D3 to be written at a relevant address of the RAM $11_0$.

The initializing process of the module $M_0$ has been described. Likewise, with DFFs, the similar process is performed for the modules $M_1$ to $M_{n-2}$. In other words, since the initialization signal, the write address signal, and the feedback data are delayed by two clock pulses whenever they are supplied to each module. Thus, in each module, the relation between the input timing of data to the matrix calculator and the write timing to the RAM is constant. The initializing process for the top data is completed with the number of clock pulses that is around twice as many as the number of outer code parity sequences. Thereafter, the outer code initializing process is continued for the length of the inner code.

Such an initializing process is performed in the period of data to be encoded with an outer code. In other words, input data becomes feedback data for a period corresponding to the length of the inner code.

After the initializing process is completed, data other than the top data is successively input. Next, a calculating process for such input data will be described. In this case, since the initializing process has been completed, the initialization signal is not generated. Thus, the selectors $14_0, 14_1, \ldots,$ and $14_{n-2}$ of the modules $M_0, M_1, \ldots,$ and $M_{n-2}$ select output data of the EX-OR gates $13_0, 13_1, \ldots,$ and $13_{n-2}$ on the preceding stages thereof, respectively. In addition, the selector 14 supplies the output data of a DFF d10 on the preceding stage thereof.

To properly perform a process after the initializing process, when data other than the top data for the initializing process is input, the RAM controller 17 should output a read address signal R-4 with an advance of four clock pulses against the input data.

When the input format of data is predefined, in four clock pulses before data other than the top data is input, a read address signal R0 (not shown) is output at the same timing of the input data. On the other hand, when the input format of data is not predefined, data is input with a delay of four clock pulses by a particular delaying circuit or the like. Thus, a read address signal R-4 with an advance of four clock pulses against the input data can be easily generated.

When the read address signal R-4 is supplied to two DFFs r10 and $r_0a$, the DFF $r_0a$ outputs a signal R-2 to the RAM $11_0$ of the module $M_0$. Thus, the RAM $11_0$ outputs data D-2 in a calculating process. When the data D-2 is supplied to two DFFs $d_0c$ and d10, the DFF d10 outputs data D0' whose phase matches the phase of the input data D0 to the selector 14. At this point, since the initializing process has been completed, the initialization signal is not supplied. Thus, the selector 14 supplies the data D0' to the EX-OR gate 13.

The EX-OR gate 13 exclusive-ORs the data D0' and the input data D0 and outputs the calculated result as feedback data FD0. When the feedback data FD0 is supplied to two DFFs fd10 and $fd_0a$, the DFF $fd_0a$ outputs a signal FD2 with a delay of two clock pulses against the data FD0 to the matrix calculator $10_0$ of the module $M_0$.

A calculated result of the matrix calculator $10_0$ is supplied to the selector $14_0$ and the EX-OR gate $13_0$. The EX-OR gate $13_0$ exclusive-ORs the output data of the matrix calculator $10_0$ and data D2 (of which data D1 received from the module M1 is supplied to the DFF $d_0a$ and then output therefrom) and supplies the calculated result to the selector $14_0$. At this point, since the initialization signal is not active, the selector $14_0$ selects the output data of the EX-OR gate $13_0$ and supplies the selected data to the next stage.

The output data of the selector $14_0$ (namely, the calculated result of the EX-OR gate $13_0$) is supplied to the DFF $d_0b$. The DFF $d_0b$ delays the data received from the selector $14_0$ by one clock pulse and supplies data D3 with a delay of three clock pulses against the input data to the RAM $11_0$. At this point, the write address signal W3 with a delay of three clock pulses against the input data is supplied to the RAM $11_0$. As with the read address signal R-2, the write address signal W3 is supplied corresponding to the input data format.

Next, a generating process for the data D1 (in a calculating process) supplied from the module $M_1$ to the module $M_0$ will be described. The structure of the module $M_1$ (not shown) is the same as the structure of the $M_0$ except that suffixes are different from each other. The read address signal R-2 is supplied to two DFFs $r_0b$ and $r_1a$ (not shown). The DFF $r_1a$ supplies a read address signal R0 with a delay of two clock pulses against the read address signal R-2 to a RAM $11_1$ (not shown) of the module $M_1$. In addition, the write address signal W3 is supplied to two DFFs $w_0b$ and $w_1a$ (not shown). The DFF $w_1a$ supplies a write address signal W5 with a delay of two clock pulses against the write address signal W3 to the next stage.

The feedback data FD2 is supplied to two DFFs $fd_0b$ and $fd_1a$ (not shown). The DFF $fd_1a$ supplies feedback data FD4 with a delay of two clock pulses against the feedback data FD2 to the matrix calculator $10_1$ (not shown) of the module $M_1$. After the processes of the matrix calculator $10_1$ and the EX-OR gate $13_1$ (not shown) corresponding to data D4 (not shown) are performed, the data from the EX-OR gate $13_1$ is supplied to a DFF $d_1b$. The DFF $d_1b$ delays the data by one clock pulse. Thus, data D5 (in a calculating process) (not shown) with a delay of five clock pulses against the input data D0 is supplied to the RAM $11_1$.

In other words, in the module $M_1$, the read address signal, the write address signal, and the feedback signal are delayed by two clock pulses each against those in the module $M_0$.

Thus, in the module $M_1$, the relative timing between each of these three signals and data in the calculating process is the same as that in the module $M_0$. The data D5 with a delay of five clock pulses against the input data is written to the RAM $11_1$. In addition, data D0" (not shown) without a delay against the data D5 is read from the RAM $11_1$. The data D0" is supplied to a DFF $d_1c$ (not shown). The DFF $d_1c$ supplies the data D1 with a delay of one block pulse against the data D0" to the module $M_0$.

Likewise, whenever the read address signal, the write address signal, and the feedback data are supplied to each of the modules $M_2, M_3, \ldots,$ and $M_{n-2}$, these signals are delayed by two clock pulses each. Thus, in each module, the relative timing between each of the read address signal, the write address signal, and the feedback data and data in a calculating process is constant.

In the module $M_{n-1}$, a read address signal R2x(n-2) is supplied to the RAM $11_{n-1}$ of the module $M_{n-1}$. In addition, a write address signal W2x(n-1)+3 is supplied to the RAM $11_{n-1}$ of the module $M_{n-1}$. Moreover, feedback data FD2x (n-1)+2 is supplied to the matrix calculator $10_{n-1}$.

As described above, the encoding process corresponding to the input data is completed in the period of the number of clock pulses that are nearly twice as many as the number of outer code parities. Such a process is continued for the length of the inner code. Thereafter, the process for the length of the inner code is repeated for the length of the outer code. Thus, the encoding process with the outer code is completed.

With the above-described processes, when all data has been input, outer code parities are stored in the individual RAMs as they are generated.

Next, a process for reading an outer code parity will be described. In this process, the Switch Cont signal is active. Thus, the feedback data selecting switch 15 is placed in the position so that 00$h$ is output as feedback data. In addition, the output data selecting switch 16 is placed in the position so that output data of the selector 14 is supplied as output data of the error correction code calculator to the next stage thereof. In the following description, the calculated outer code parity is denoted by P. The delay time is denoted by the number of clock pulses. For example, parity data with a delay of one clock pulse is denoted by P1.

In four clock pulses before the first parity data to be read, the RAM controller 17 generates the read address signal R-4. The read address signal R-4 is delayed by two clock pulses. The resultant signal is supplied as a signal R-2 to the RAM $11_0$. Thus, the RAM $11_0$ outputs an outer code parity P-2. The outer code parity P-2 is delayed by two clock pulses. The resultant parity is supplied as a parity P0 to the output data selecting switch 16. In such a manner, the outer code parity stored in the RAM $11_0$ of the module $M_0$ is output.

On the other hand, the feedback data selecting switch 15 is placed in the position so that the feedback data FD0 that is 00$h$ is delayed by two clock pulses whenever the feedback data FD0 is supplied to each module. The feedback data FD0 is supplied to the matrix calculators $10_0, 10_1, \ldots,$ and $10_{n-1}$ of the modules $M_0, M_1, \ldots,$ and $M_{n-1}$, respectively. Thus, each of the matrix calculators $10_0, 10_1, \ldots,$ and $10_{n-1}$ supplies 00$h$ to the EX-OR gates $13_0, 13_1, \ldots,$ and $13_{n-1}$ on the next stages thereof.

Thus, the EX-OR gates $13_0, 13_1, \ldots,$ and $13_{n-1}$ supply output data of a DFF $d_0a$, a DFF $d_1a, \ldots,$ and a DFF $d_{n-1}a$ on the preceding stages thereof, respectively. Consequently, the outer code parities stored in the individual RAMs are successively shifted in the direction of the output data selecting switch 16 corresponding to the read address signal and supplied through the output data selecting switch 16.

In the above-described process, after the parity data for the length of the inner code has been output, the content of the RAM $11_0$ is substituted with the content of the RAM $11_1$ stored at which the parity data was output. Likewise, all outer code parities are output. The contents of the RAMs $11_{n-1}, 11_{n-21}, \ldots$ and so forth are successively substituted with 00$h$. After all the outer code parities have been supplied, the contents of the RAMs become 00$h$.

Figure 10:
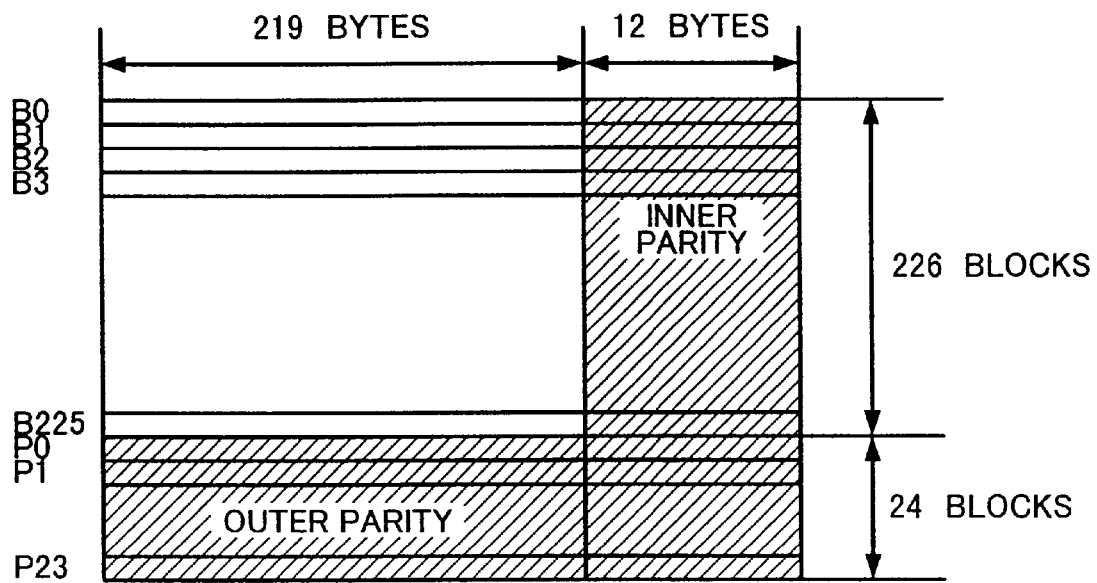
FIG. 10 is a schematic diagram for explaining a practical example of the structure of the embodiment of the present invention.
Figure 11:
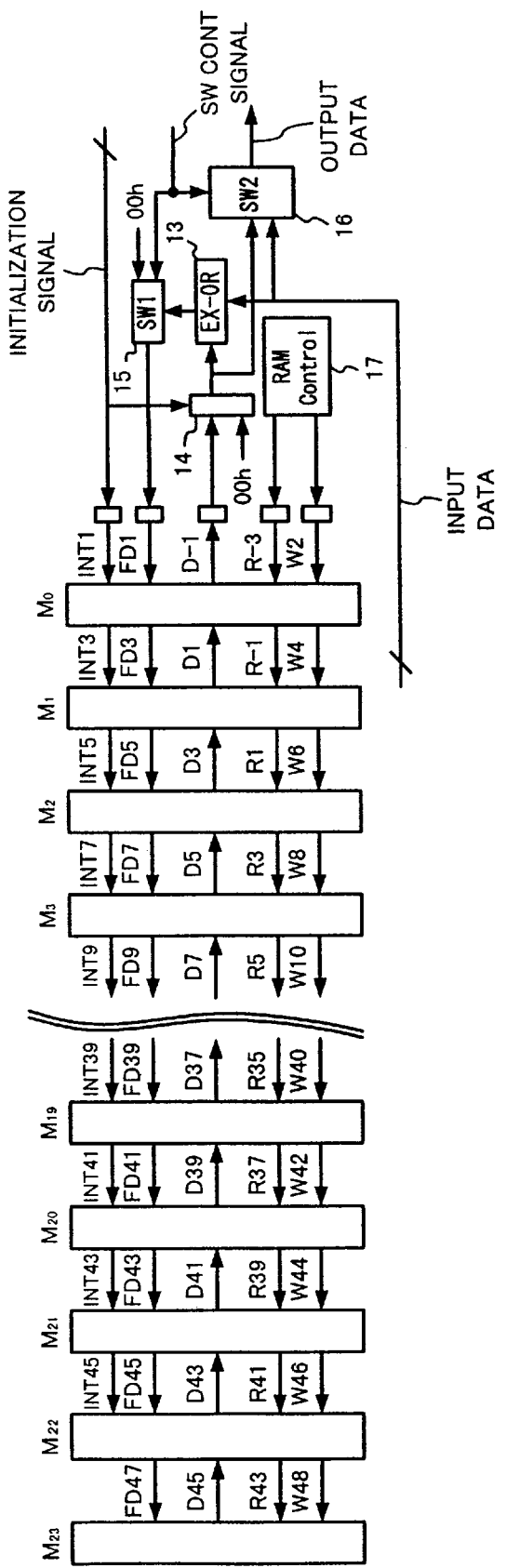
FIG. 11 is a block diagram for explaining a practical example of the structure of the embodiment of the present invention.

Next, with reference to FIGS. 10, 11, and 12, an encoding process with a product code according to an embodiment of the present invention will be described. FIG. 10 shows an encoding process with a product code. In FIG. 10, the length of an inner code is 219 bytes and the length of an inner code party is 12 bytes. Assuming that the minimum encoding unit of the inner code is one block, the length of an outer code is 226 blocks and the length of an outer code parity is 24 blocks. FIG. 11 shows an example of the structure of an error correction code calculator that accomplishes an encoding process with such a product code. In this case, the storage capacitance of the RAM in each module is 219 symbols (one symbol is equivalent to one byte). The number of RAMs (namely, the number of modules) is equal to the number of outer code parities. Thus, 24 RAMs (modules) are required.

As input data, 226 blocks (one block is composed of 219 bytes+12 bytes) are successively input. As shown in FIG. 12A, in the period of which a B0 block (219 bytes) as the first block is input and the initializing process is performed, the initialization signal is active. The initialization signal is delayed as signals INT1 to INT45 and supplied to the individual modules.

As described above with reference to FIGS. 8 and 9, when the initialization signal becomes active, the B0 block is supplied as feedback data FD1 to FD47 to the individual modules. The feedback data FD1 to FD47 are written to the RAMs of the modules through respective matrix calculators thereof. Write address signals W2 to W45 with delays are supplied to the individual modules.

As shown in FIG. 12A, after the initializing process has been completed, the initialization signal becomes inactive. In four clock pulses before the data B1 is input, the read address signal R-4 is supplied from the RAM controller 17. The read address signal R-4 is supplied as signals R-3 to R43 to the modules $M_0$ to $M_{23}$ through one DFF, respectively. The output data of the matrix calculator in each module and output data of the RAM of the module on the next stage thereof are exclusive-ORed at the timing of the same address data of each RAM and written to each RAM.

After the last input data B225 has been input, at a timing shown in FIG. 12C, the SW Cont signal becomes active. Thus, the feedback data selecting switch 15 selects 00$h$ and outputs it. Thus, the feedback data FD1 to FD47 successively become 00$h$. In addition, the output data selecting switch 16 selects output data of the RAM of the module $M_0$ and successively supplies 12 blocks of the outer code parities at a time to the next stage.

Since the feedback data is 00$h$, a total of 24 outer code parities stored in the RAMs are shifted in the direction of the output data selecting switch 16. The outer code parity P23 stored in the module 23 is stored in the RAM of the module $M_0$ after 23 parities P0 to P22 have been output. After the parity P23 has been output, the process is completed.

In the above-described embodiment, DFFs are disposed on the preceding stages and next stages of the RAMs and on the preceding stages of the EX-OR gates. To cause these DFFs to match the delay time of data in the calculating process, other DFFs are disposed on the paths of the read address signal, the write address signal, and the feedback data. Thus, the relative timing between each of the read address signal, the write address signal, and the feedback data and data in a calculating process becomes constant. On the other hand, when the probability of which the timing of each signal deviates is small, one set of DFFs may be removed in such a manner that the relative timing is not varied. For example, in FIGS. 8 and 9, the DFF $in_0a$, the DFF $fd_0a$, the DFF $d_0c$, the DFF $r_0a$, and the DFF $w_0a$ disposed in the vertical direction may be removed as a set. Thus, delay time and circuit structure for the data process can be decreased.

As described above, according to the present invention, DFFs are disposed on the paths of the input/output signals, the write address signal, and the read address signal in each of the RAMs of the error correction code calculator. In addition, DFFs are disposed on the path of the feedback data. Thus, the relative timing between the data in the calculating process and each of the read address signal, the write address signal, and the feedback data becomes constant. Consequently, the RAMs can be operated at high speed. As a result, a desired process can be performed at the maximum speed.

In addition, due to delays of DFFs, for example, a write address signal is supplied to all RAMs at a proper timing. Thus, with one write address signal and one read address signal generated, all RAMs can be controlled. Consequently, it is not necessary to provide a number of circuits that generate the write address signal and the read address signal corresponding to the number of RAMs (namely, the number of parities). Instead, since only one circuit is required, the circuit scale can be decreased.

When the number of outer code parities is increased, the operation speed of the circuit is restricted due to the length of the path of the feedback data. However, such a restriction can be solved with DFFs disposed on the path of the feedback data.

When the error correction code calculator is composed of an ASIC, since the restriction of timings due to locations and connections of devices in the ASIC is alleviated, the number of steps for placing devices and adjusting connections in the ASIC can be decreased. Thus, the development period for the ASIC can be shortened.

In the error correction code calculator, each module has the same structure except for the matrix calculator. Thus, without need to consider timing restrictions, modules can be easily expanded.

In addition, since each module is composed of a PLD (Programmable Logic Device) or the like, a product code generated by a RAM can be accomplished with a discrete circuit that operates at high speed.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A Reed Solomon error correction code calculator, comprising:
   a plurality of modules, each including a memory and a matrix calculator, said plurality of modules being cascade connected; and
   at least one register disposed at at least one input of each of the memory and the matrix calculator of each of said plurality of modules.

2. The Reed Solomon error correction code calculator as set forth in claim 1, wherein at least one of said plurality of modules further comprises an exclusive-OR circuit.

3. The error correction code calculator as set forth in claim 1, wherein
   data is encoded with a product code for dually encoding each symbol, the product code being a Reed Solomon inner code and a Reed Solomon outer code, and
   the memory of each of the plurality of modules has a storage capacity for the number of symbols for an interleave length or equivalent thereto.

4. The error correction code calculator as set forth in claim 3,
   wherein the inner code length is the interleave length, and
   wherein the error correction code calculator further comprises:
      a separate plurality of modules corresponding to the number of outer code parities, each of the separate plurality of modules including at least a memory having a storage capacity for the number of symbols for the interleave length or equivalent thereto so as to calculate the outer code parities.

5. The error correction code calculator as set forth in claim 3,
   wherein a control signal for controlling the operation of one memory is generated so as to control the operations of the memory of a predetermined number of the plurality of modules.

* * * * *